United States Patent
Agawa et al.

(10) Patent No.: US 11,768,236 B2
(45) Date of Patent: Sep. 26, 2023

(54) TEST DEVICE CONTROL METHOD AND TEST DEVICE

(71) Applicant: TOKYO ELECTRON LIMITED, Tokyo (JP)

(72) Inventors: Hiroaki Agawa, Yamanashi (JP); Masahito Kobayashi, Yamanashi (JP); Shigeru Kasai, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/539,951

(22) Filed: Dec. 1, 2021

(65) Prior Publication Data

US 2022/0178994 A1 Jun. 9, 2022

(30) Foreign Application Priority Data

Dec. 7, 2020 (JP) ................................ 2020-202986

(51) Int. Cl.
*G01R 31/28* (2006.01)

(52) U.S. Cl.
CPC ................................ *G01R 31/2891* (2013.01)

(58) Field of Classification Search
CPC ...... G01R 31/28; G01R 1/44; G01R 31/2817; G01R 31/2865; G01R 31/2874; G01R 31/2891; G05D 23/20
USPC ..................................................... 324/754.1
See application file for complete search history.

(56) References Cited

U.S. PATENT DOCUMENTS

| 6,037,793 A | 3/2000 | Miyazawa et al. |
| 2007/0268033 A1* | 11/2007 | Fujita ................. G01R 31/2891 324/750.19 |
| 2008/0018352 A1* | 1/2008 | Chiba ................ G01R 31/2865 324/750.04 |
| 2009/0102499 A1 | 4/2009 | Segawa et al. |
| 2018/0269089 A1 | 9/2018 | Merchant et al. |
| 2020/0341031 A1 | 10/2020 | Fujihara et al. |

FOREIGN PATENT DOCUMENTS

| JP | 2019-102645 A | 6/2019 |
| WO | WO 2021/014724 A1 | 1/2021 |

* cited by examiner

*Primary Examiner* — Jermele M Hollington
*Assistant Examiner* — Courtney G McDonnough
(74) *Attorney, Agent, or Firm* — Fenwick & West LLP

(57) ABSTRACT

There is provided a control method of a test device, the test device comprising a chuck on which an object to be tested is mounted, a tester configured to supply electric power to the object to be tested to test the object to be tested, and a controller configured to control a temperature of the chuck. The control method comprises: when an actual temperature of the object to be tested cannot be fed back, estimating a temperature difference between the temperature of the chuck and the temperature of the object to be tested on the basis of a heat amount of the object to be tested; correcting a target temperature of the chuck on the basis of a target temperature of the object to be tested and the temperature difference; and controlling the temperature of the chuck on the basis of the corrected target temperature of the chuck and an actual temperature of the chuck.

8 Claims, 8 Drawing Sheets

TEST DEVICE CONTROL METHOD AND TEST DEVICE

CROSS-REFERENCE TO RELATED APPLICATION

This application claims priority to Japanese Patent Application No. 2020-202986 filed on Dec. 7, 2020, the entire contents of which are incorporated herein by reference.

TECHNICAL FIELD

The present disclosure relates to a test device control method and a test device.

BACKGROUND

A test device for testing electrical characteristics of electronic devices by placing a wafer, on which the electronic devices are formed, or a carrier, on which the electronic devices are disposed, on a mounting table and supplying a current to the electronic devices from a tester through probes or the like is known. The temperatures of the electronic devices are controlled by a cooling mechanism or a heating mechanism in the mounting table.

In Japanese Patent Application Publication No. 2019-102645, a prober, which includes a temperature detection unit that detects a temperature of a chip to be tested on the basis of an electrical potential difference between electrode pads corresponding to respective electrodes of an element for temperature measurement by bringing probe needles into contact with the electrode pads connected to the element for temperature measurement in the chip to be tested, is disclosed.

SUMMARY

However, it is difficult to continuously detect a temperature of an electronic device using an element for temperature measurement in consideration of a trade-off with a test flow. Further, when a heat amount of the electronic device is large, a difference in temperature between the electronic device and a mounting table becomes large, and thus it is difficult to control the temperature of the electronic device with a temperature sensor provided on the mounting table.

In one aspect, the present disclosure is directed to providing a test device control method, in which temperature controllability of an object to be tested is improved, and a test device.

In accordance with an aspect of the present disclosure, there is provided a control method of a test device, the test device comprising a chuck on which an object to be tested is mounted, a tester configured to supply electric power to the object to be tested to test the object to be tested, and a controller configured to control a temperature of the chuck. The control method comprises: when an actual temperature of the object to be tested cannot be fed back, estimating a temperature difference between the temperature of the chuck and the temperature of the object to be tested on the basis of a heat amount of the object to be tested; correcting a target temperature of the chuck on the basis of a target temperature of the object to be tested and the temperature difference; and controlling the temperature of the chuck on the basis of the corrected target temperature of the chuck and an actual temperature of the chuck.

DETAILED DESCRIPTION

Figure 1:
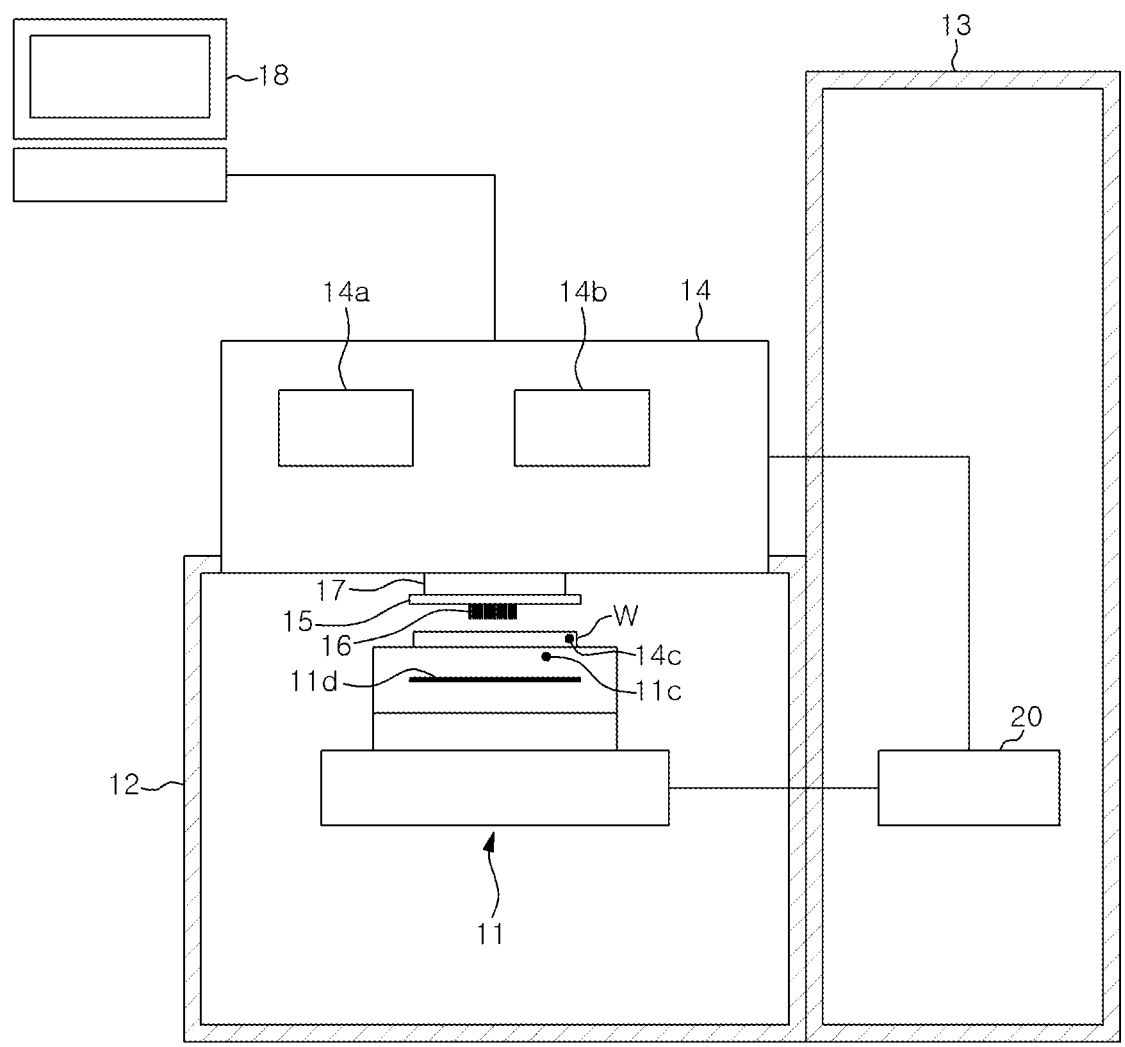
FIG. 1 is a schematic cross-sectional view for describing a configuration of a test device according to an embodiment.

Hereinafter, embodiments of the present disclosure will be described with reference to the accompanying drawings. In each drawing, like reference numerals denote like elements and descriptions thereof will not be repeated.

<Test Device>

A test device 10 according to an embodiment of the present disclosure will be described with reference to FIG. 1. FIG. 1 is an example of a schematic cross-sectional view for describing a configuration of the test device 10 according to the embodiment of the present disclosure.

The test device 10 is a device for testing electrical characteristics of each of a plurality of electronic devices (i.e., objects to be tested; device under test (DUT)) formed on a wafer (substrate) W. Meanwhile, a substrate having objects to be tested is not limited to the wafer W and includes a carrier on which electronic devices are disposed, a glass substrate, a single chip, or the like. The test device 10 includes an accommodation chamber 12 that accommodates a chuck 11 on which the wafer W is placed, a loader 13 disposed adjacent to the accommodation chamber 12, and a tester 14 disposed to cover the accommodation chamber 12.

The accommodation chamber 12 has a shape of a hollow housing. The chuck 11 on which the wafer W is placed and a probe card 15 disposed to face the chuck 11 are accommodated inside the accommodation chamber 12. The probe card 15 has a plurality of needle-shaped probes (contact terminals) 16 disposed to correspond to electrode pads or solder bumps which are provided to correspond to electrodes of each electronic device of the wafer W.

The chuck 11 has a fixing mechanism (not shown) for fixing the wafer W to the chuck 11. Thereby, the deviation of a relative position of the wafer W with respect to the chuck 11 is prevented. Further, a moving mechanism (not shown) for moving the chuck 11 in a horizontal direction and a vertical direction is provided in the accommodation chamber 12. Thereby, relative positions of the probe card 15 and the wafer W are adjusted so that the electrode pads or solder bumps which are provided to correspond to the electrodes of each electronic device are brought into contact with each probe 16 of the probe card 15. Further, the chuck 11 includes a temperature sensor 11c. Further, the chuck 11 includes a temperature controller 11d such as a heater, a cooler, or the like. Information on a temperature of the chuck 11, which is detected by the temperature sensor $11c$, is transmitted to a controller 20. The temperature controller $11d$ is controlled by the controller 20.

The loader 13 withdraws the wafer W, on which the electronic devices are disposed, from a front opening unified pod (FOUP) (not shown) which is a transfer container, places the wafer W on the chuck 11 inside the accommodation chamber 12, and removes the tested wafer W from the chuck 11 to accommodate it in the FOUP.

The probe card 15 is connected to the tester 14 through an interface 17, and when each probe 16 is brought into contact with the electrode pads or solder bumps which are provided to correspond to electrodes of each electronic device of the wafer W, each probe 16 supplies electric power to the electronic device from the tester 14 through the interface 17 or transmits a signal from the electronic device to the tester 14 through the interface 17.

The tester 14 has a test board (not shown) for reproducing a part of a circuit configuration of a motherboard on which electronic devices are mounted, and the test board is connected to a tester computer 18 for determining whether the electronic device is good or not based on the signal from the electronic device. In the tester 14, by replacing the test board, it is possible to reproduce the circuit configuration of a plurality of types of motherboards.

The tester 14 has an electric power supply $14a$ for supplying electric power to the electronic device through the probe 16. The tester 14 transmits information on the electric power supplied to the electronic device to the controller 20.

The tester 14 has a temperature detection unit $14b$ for detecting a temperature of the electronic device. An element $14c$ for temperature measurement is provided on the wafer W. The element $14c$ for temperature measurement is, for example, a diode or the like and is an element whose electrical potential difference varies according to a temperature thereof. The temperature detection unit $14b$ measures an electrical potential difference between both terminals of the element $14c$ using the probe 16 and detects the temperature of the element $14c$ on the basis of the electrical potential difference. The tester 14 transmits information on the temperature of the electronic device detected by using the element $14c$ to the controller 20.

The controller 20 controls the temperature of the chuck 11 by controlling the temperature controller $11d$ of the chuck 11.

Figure 2:
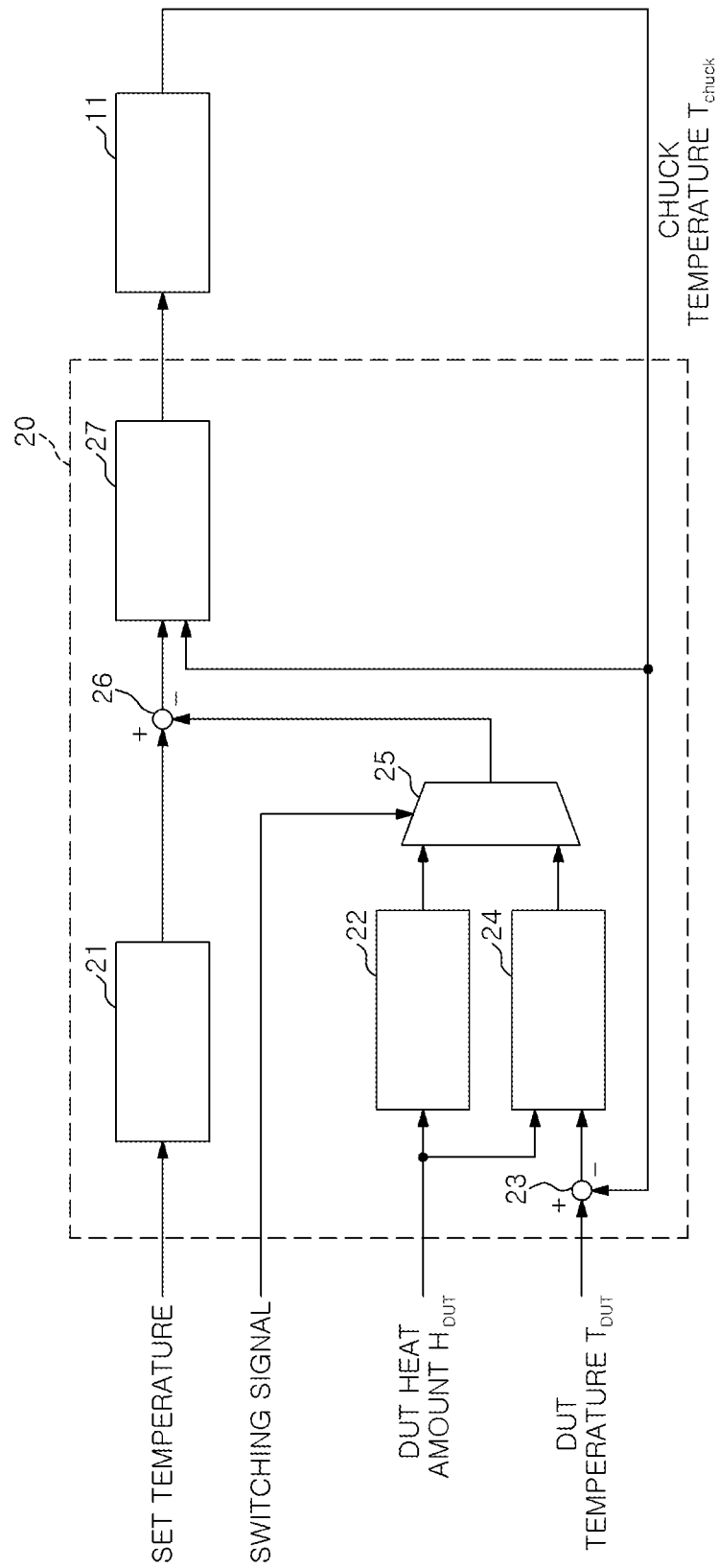
FIG. 2 is an example of a block diagram for describing control of a temperature of a chuck.

Next, the controller 20 will be described with reference to FIG. 2. FIG. 2 is an example of a block diagram for describing control of the temperature of the chuck 11.

The controller 20 includes a target temperature generation unit 21, a temperature difference estimation unit 22, a dead time compensation unit 24, a selector 25, and a model tracking controller 27. Here, an actual temperature (chuck temperature $T_{chuck}$) of the chuck 11, which is detected by the temperature sensor $11c$, is input to the controller 20. Further, an actual temperature (DUT temperature $T_{DUT}$) of an electronic device (i.e., DUT) to be tested, which is detected by the temperature detection unit $14b$, is input to the controller 20. However, the DUT temperature $T_{DUT}$ is a temperature that cannot be obtained depending on a test flow. Further, information on the electric power which is supplied to the electronic device to be tested from the electric power supply $14a$ is input to the controller 20. Here, a heat amount (DUT heat amount $H_{DUT}$) of the electronic device to be tested may be estimated based on the supplied electric power. In the example of FIG. 2, it is assumed that the DUT heat amount $H_{DUT}$ is input to the controller 20.

A set temperature of the electronic device is input to the controller 20. For example, the set temperature is input to the controller 20 from the tester computer 18. Further, a switching signal is input to the controller 20. The switching signal is a signal indicating whether a test flow is capable of obtaining the DUT temperature $T_{DUT}$. For example, the switching signal is input to the controller 20 from the tester computer 18.

The target temperature generation unit (device target temperature generation unit) 21 generates a target temperature $T_0$ of the electronic device. Specifically, the set temperature of the electronic device is input to the target temperature generation unit 21 from the tester computer 18. Further, the target temperature generation unit 21 has a reference model in which a change in the set temperature over time is associated with a change in the target temperature $T_0$ over time. The target temperature generation unit 21 generates the target temperature $T_0$ of the electronic device on the basis of the input set temperature of the electronic device and the reference model.

The temperature difference estimation unit 22 estimates an estimated value (estimated temperature difference value $\Delta T1$) of a difference in temperature between the electronic device and the chuck 11. Specifically, the temperature difference estimation unit 22 estimates the estimated temperature difference value $\Delta T1$ between the electronic device and the chuck 11 on the basis of the DUT heat amount $H_{DUT}$.

Figure 3A:
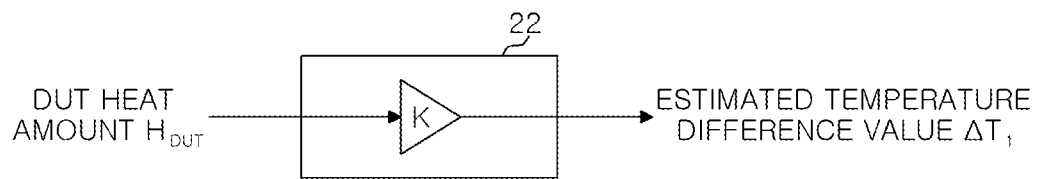
FIGS. 3A and 3B are examples of a block diagram for describing a temperature estimation unit.
Figure 3B:
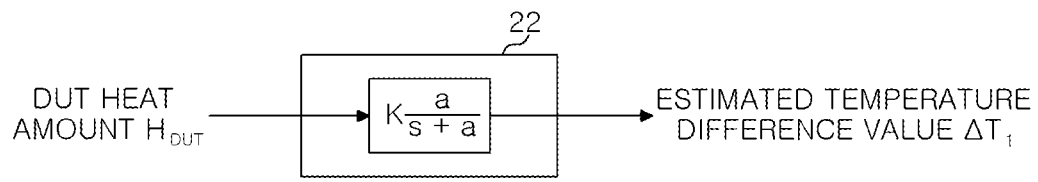

FIGS. 3A and 3B are examples of a block diagram for describing the temperature difference estimation unit 22. As shown in FIG. 3A, the temperature difference estimation unit 22 may estimate the estimated temperature difference value $\Delta T_1$ by multiplying the DUT heat amount $H_{DUT}$ by a parameter (steady gain) K. Further, as shown in FIG. 3B, the temperature difference estimation unit 22 may estimate the estimated temperature difference value $\Delta T_1$ using a first order delay function. That is, the parameter specifies a time constant $1/a$ in addition to the steady gain K. By using the first order delay, control may be performed in consideration of dynamic characteristics of changes in temperature.

Figure 4:
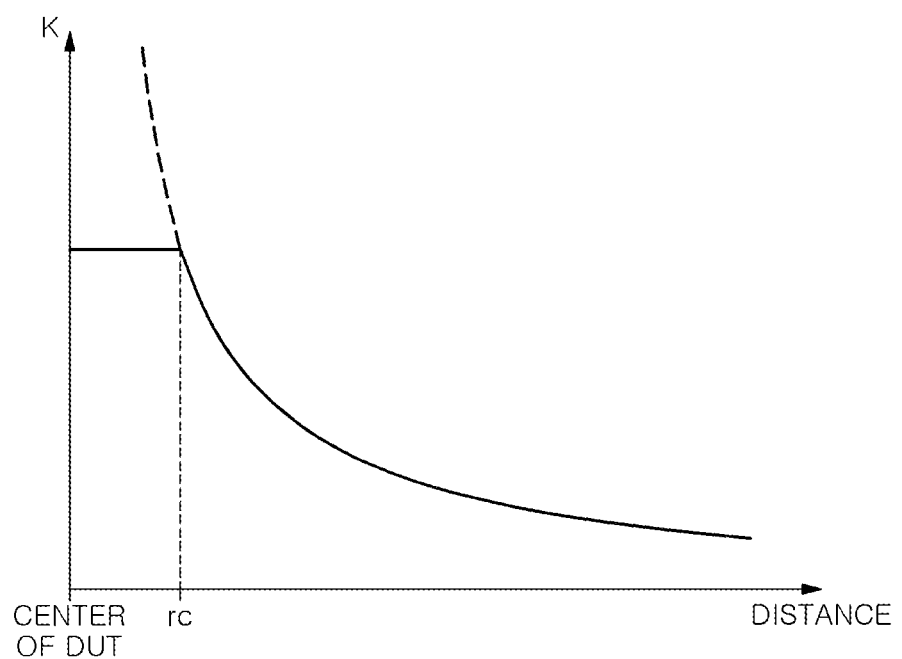
FIG. 4 is an example of a graph for describing a method of adjusting a parameter.

FIG. 4 is an example of a graph for describing a method of adjusting a parameter. Here, the steady gain K depends on a position of the electronic device on the chuck 11. Further, a horizontal axis of FIG. 4 indicates a distance from the center of the electronic device and a vertical axis indicates the parameter K.

Here, the changes in temperature caused by the heat generated by the electronic device is roughly inversely proportional to the distance from the center of the electronic device. Therefore, the parameter K may be expressed by an equation K=a/r+b, where r denotes a distance between a position of the temperature sensor $11c$ in the chuck 11 and the center of the electronic device to be tested. Further, a and b are device-specific parameters. Further, within a range (r<rc) in which the distance r is small, the parameter K may be expressed by an equation K=a/rc+b.

Figure 5:
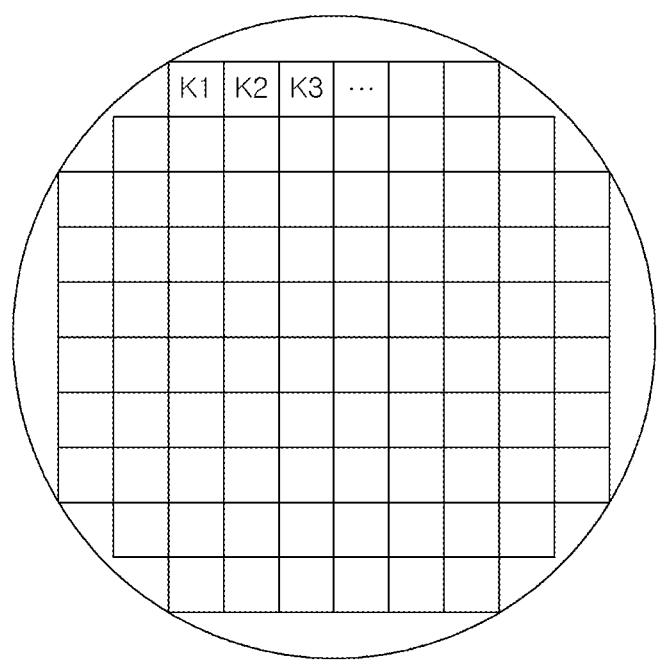
FIG. 5 is an example of a diagram for describing a method of adjusting a parameter.

FIG. 5 is an example of a diagram for describing a method of adjusting a parameter K. In the method shown in FIG. 4, the steady gain K is described as being estimated using the distance r, but as shown in FIG. 5, parameters K1, K2, K3, . . . may be set in advance for position of each electronic device. Thereby, estimation accuracy of the estimated temperature difference value $\Delta T1$ estimated by the temperature difference estimation unit 22 may be improved.

Referring to FIG. 2 again, a subtractor (actual temperature difference calculation unit) 23 calculates a difference (actually measured temperature difference value $\Delta T_2$) in temperature between the electronic device and the chuck 11.

Specifically, the subtractor 23 calculates the actually measured temperature difference value $\Delta T_2$ between an actual temperature (DUT temperature $T_{DUT}$) of the electronic device and an actual temperature (chuck temperature $T_{chuck}$) of the chuck 11.

The dead time compensation unit 24 estimates a difference (compensated temperature difference value $\Delta T_{2a}$) in temperature between the electronic device and the chuck 11 by performing a dead time compensation for the actually measured temperature difference value $\Delta T_2$.

Figure 6:
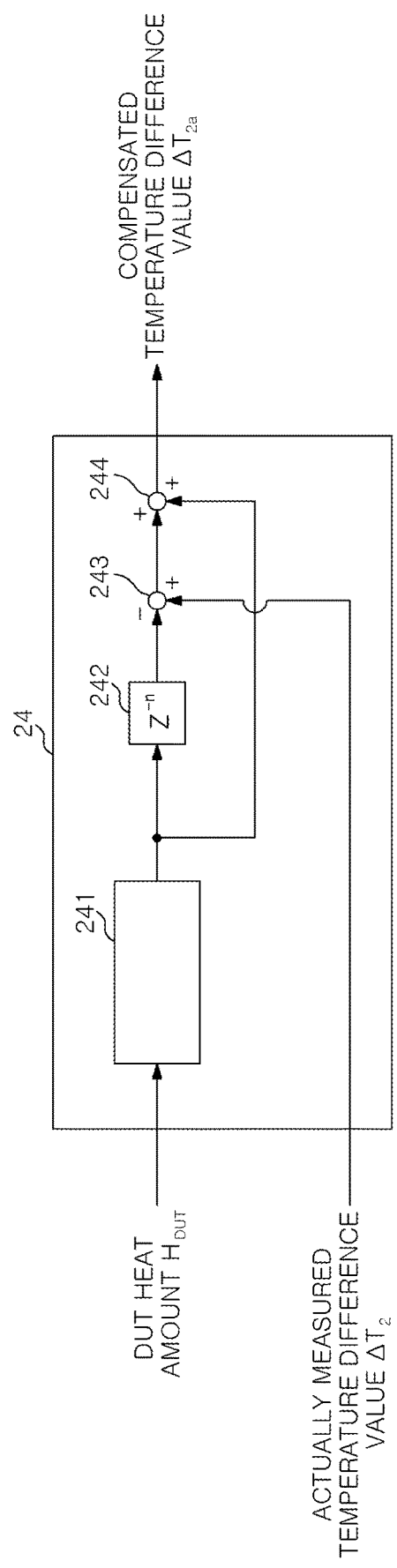
FIG. 6 is an example of a block diagram for describing a dead time compensation unit.

FIG. 6 is an example of a block diagram for describing the dead time compensation unit 24. The dead time compensation unit 24 shown in FIG. 6 is the same as a general Smith compensator. By performing Smith compensation, a temperature difference $\Delta T$ between an input of a disturbance and a response can be compensated using an estimated value.

The dead time compensation unit 24 includes a temperature difference estimation unit 241, a delay processing unit 242, a subtractor 243, and an adder 244. The temperature difference estimation unit 241 estimates a difference in temperature between the electronic device and the chuck 11 on the basis of the DUT heat amount $H_{DUT}$. The delay processing unit 242 outputs the difference in temperature between the electronic device and the chuck 11 estimated by the temperature difference estimation unit 241 to be delayed by n steps. The subtractor 243 calculates a difference between the actually measured temperature difference value $\Delta T_2$ and an output value of the delay processing unit 242. The adder 244 calculates the sum of an output value of the temperature difference estimation unit 241 and an output value of the subtractor 243 and outputs the calculated sum as a compensated temperature difference value $\Delta T_{2a}$.

With such a configuration, the actually measured temperature difference value $\Delta T_2$ is not changed due to the delay during n steps after power supply to the electronic device is started. For this reason, the dead time compensation unit 24 outputs the estimated temperature difference value of the temperature difference estimation unit 241 as the compensated temperature difference value $\Delta T_{2a}$. Then, when the temperature of the electronic device enters a steady state, the output value of the delay processing unit 242, which is subtracted by the subtractor 243, and the output value of the temperature difference estimation unit 241, which is added by the adder 244, are canceled. For this reason, the dead time compensation unit 24 outputs the actually measured temperature difference value $\Delta T_2$ as the compensated temperature difference value $\Delta T_{2a}$.

Referring to FIG. 2 again, the selector 25 receives the estimated temperature difference value $\Delta T_1$ of the temperature difference estimation unit 22 and the compensated temperature difference value $\Delta T_{2a}$ of the dead time compensation unit 24 and outputs one of the values. A switching signal is input to the selector 25. When the DUT temperature can be detected by the temperature detection unit 14b, the selector 25 outputs the compensated temperature difference value $\Delta T_{2a}$ of the dead time compensation unit 24. On the other hand, when the DUT temperature cannot be detected by the temperature detection unit 14b, the selector 25 outputs the estimated temperature difference value $\Delta T_1$ of the temperature difference estimation unit 22.

Referring to FIG. 2 again, a subtractor (chuck target temperature generation unit) 26 calculates a target temperature of the chuck 11 by subtracting the temperature difference ($\Delta T_1$ or $\Delta T_{2a}$) between the electronic device and the chuck 11 from the target temperature $T_0$ of the electronic device.

The model tracking controller 27 controls model tracking of the temperature controller 11d of the chuck 11 on the basis of the target temperature (output value of the subtractor 26) of the chuck 11 and the actual temperature (chuck temperature $T_{chuck}$) of the chuck 11.

Figure 7:
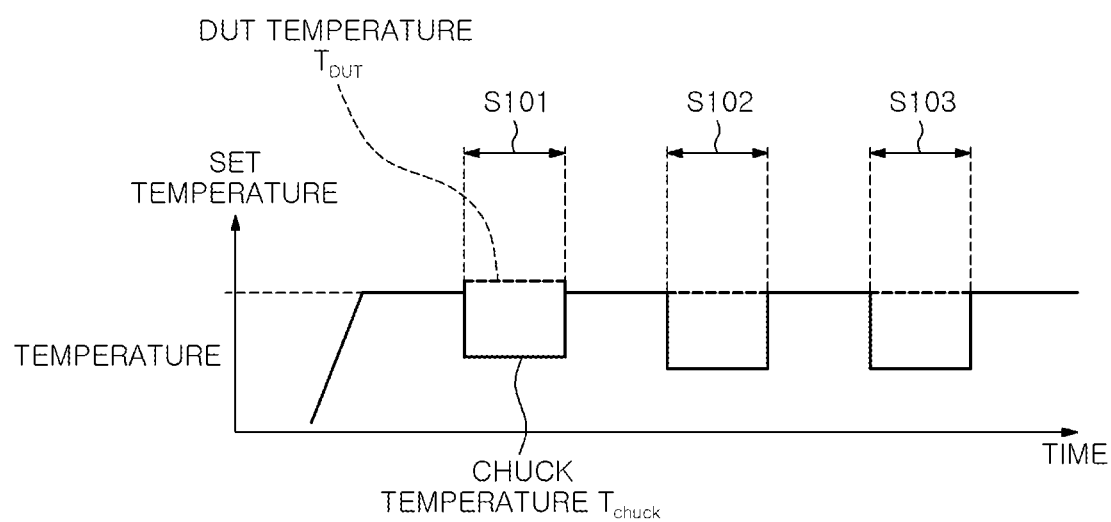
FIG. 7 is an example of a graph showing a change in temperature of an electronic device and a change in temperature of a chuck over time.

Next, control of the temperature of the electronic device using the test device 10 according to the embodiment of the present disclosure will be described with reference to FIG. 7. FIG. 7 is an example of a graph showing a change in the DUT temperature $T_{DUT}$ of the electronic device and a change in the temperature $T_{chuck}$ of the chuck 11 over time. Further, in the graph of FIG. 7, the DUT temperature $T_{DUT}$ of the electronic device is indicated by a broken line, and the temperature $T_{chuck}$ of the chuck 11 is indicated by a solid line.

First, the temperatures of the chuck 11 and the electronic device are raised to a set temperature. Thereafter, electric power is supplied to the electronic device (S101 to S103) so that a test is performed.

Step S101 is a test in which it is difficult (feedback is not possible) to detect the temperature of the electronic device using the element 14c for temperature measurement in consideration of the test flow. In this case, the controller 20 estimates the estimated temperature difference value $\Delta T_1$ from the DUT heat amount $H_{DUT}$ by the temperature difference estimation unit 22 and controls the temperature of the chuck 11 using the estimated temperature difference value $\Delta T_1$. Further, a preset value is used as the parameter K. For this reason, a slight difference may occur between the DUT temperature $T_{DUT}$ and the set temperature.

Step S102 is a test in which it is possible (feedback is possible) to detect the temperature of the electronic device using the element 14c for temperature measurement in consideration of the test flow. In this case, the controller 20 estimates the compensated temperature difference value $\Delta T_{2a}$ by performing the dead time compensation for the actually measured temperature difference value $\Delta T_2$ by the dead time compensation unit 24 and controls the temperature of the chuck 11 using the compensated temperature difference value $\Delta T_{2a}$. Here, since the temperature of the chuck 11 is controlled based on the actual temperature (DUT temperature $T_{DUT}$) of the electronic device, the temperature of the electronic device can be more appropriately controlled.

Figure 8:
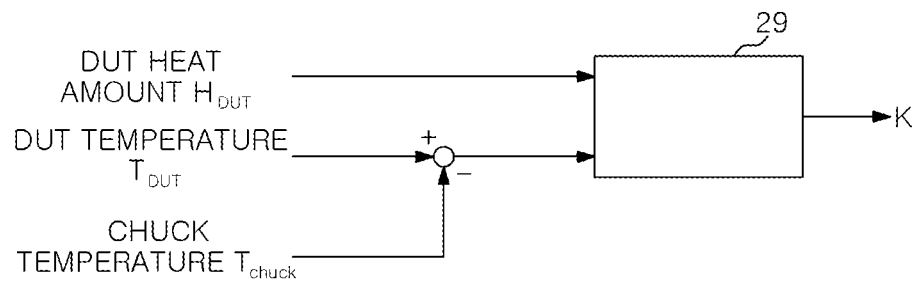
FIG. 8 is an example of a block diagram for describing a configuration of parameters.

Further, in step S102, the parameter K is adjusted. FIG. 8 is an example of a block diagram for describing adjustment of the parameter K. The controller 20 further includes a subtractor (actual temperature difference calculation unit) 28 and a parameter generation unit 29. The subtractor 28 calculates a difference in temperature between the electronic device and the chuck 11. Specifically, the subtractor 28 calculates an actually measured temperature difference value $\Delta T_2$ between the actual temperature (DUT temperature $T_{DUT}$) of the electronic device and the actual temperature (chuck temperature $T_{chuck}$) of the chuck 11. The parameter generation unit 29 calculates (adjusts) the parameter K on the basis of the DUT temperature $T_{DUT}$ and the actually measured temperature difference value $\Delta T_2$ which is calculated by the subtractor 28. The parameter K adjusted by the parameter generation unit 29 is output to the temperature difference estimation unit 22 (see FIG. 2). The parameter K of the temperature difference estimation unit 22 is updated.

Referring to FIG. 7 again, step S103 is a test in which it is difficult (feedback is not possible) to detect the temperature of the electronic device using the element 14c for temperature measurement in consideration of the test flow. In this case, the controller 20 estimates the estimated temperature difference value $\Delta T_1$ from the DUT heat amount $H_{DUT}$ by the temperature difference estimation unit 22 and controls the temperature of the chuck 11. Further, the value adjusted by the parameter generation unit 29 in step S102 is used as the parameter K. For this reason, the temperature of the electronic device can be more appropriately controlled.

Figure 9A:
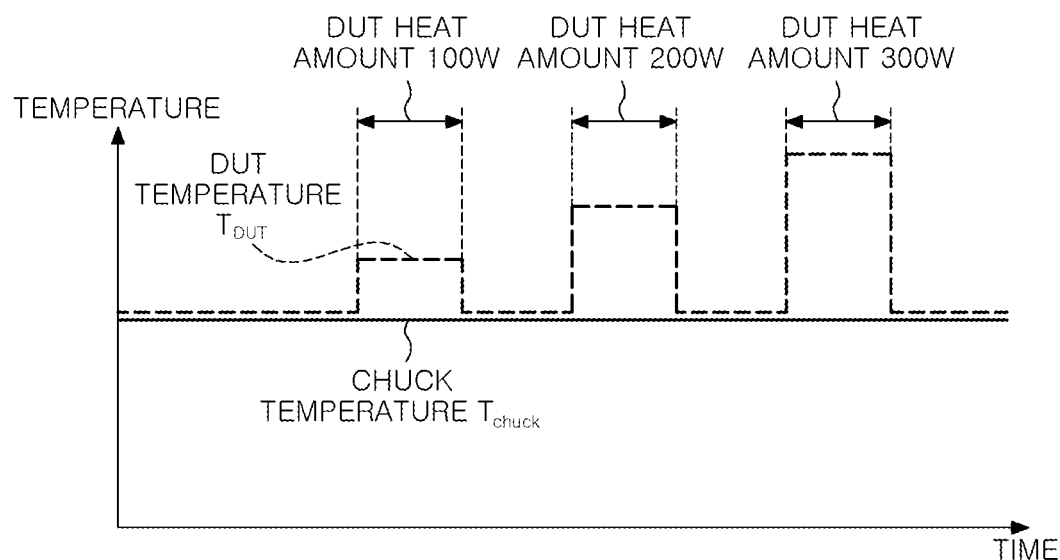
FIGS. 9A and 9B are other examples of a graph showing a change in temperature of an electronic device and a change in temperature of a chuck over time.
Figure 9B:
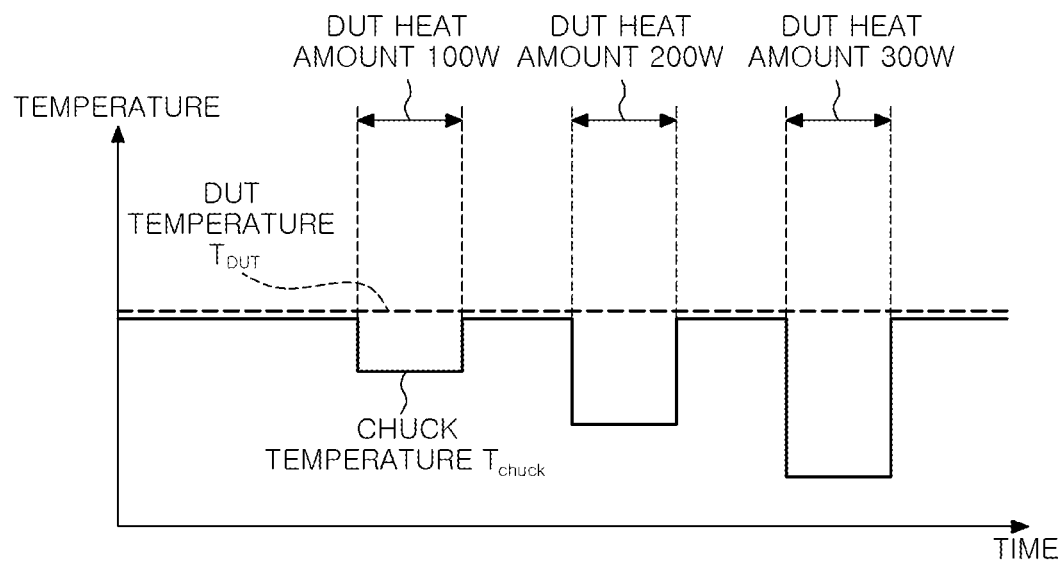

FIGS. 9A and 9B are another examples of a graph showing a change in the DUT temperature $T_{DUT}$ of the electronic device and a change in the temperature Tchuck of the chuck 11 over time.

FIG. 9A is a graph showing the DUT temperature $T_{DUT}$ of the electronic device and the temperature $T_{chuck}$ of the chuck 11 in the case in which the temperature of the chuck 11 is controlled to be constant. By supplying electric power to the electronic device during a test, the electronic device generates heat and the DUT temperature $T_{DUT}$ of the electronic device rises.

On the other hand, FIG. 9B is a graph showing the DUT temperature $T_{DUT}$ of the electronic device and the temperature $T_{chuck}$ of the chuck 11 in the case in which the control of the present embodiment is performed. By lowering the temperature of the chuck 11 on the basis of the DUT heat amount $H_{DUT}$ of the electronic device, the DUT temperature $T_{DUT}$ of the electronic device can be controlled to be constant.

Although the test device 10 has been described above, the present disclosure is not limited to the above-described embodiment and the like and various modifications and improvements may be made within the scope of the gist of the present disclosure as described in the claims.

What is claimed is:

1. A control method of a test device, the test device comprising a chuck on which a substrate is mounted, a plurality of objects to be tested being formed on the substrate, a tester configured to supply electric power to an object to be tested among the plurality of objects to be tested to test the object to be tested, and a controller configured to control a temperature of the chuck, the control method comprising:
    receiving, by the controller, a signal indicating whether the controller is capable of obtaining an actual temperature of the object to be tested or not;
    when the actual temperature of the object to be tested cannot be fed back, estimating a heat amount generated by the object to be tested based on information on the electric power supplied to the object to be tested and estimating a temperature difference between the temperature of the chuck and the temperature of the object to be tested on the basis of the estimated heat amount generated by the object to be tested;
    correcting a target temperature of the chuck on the basis of a target temperature of the object to be tested and the temperature difference; and
    controlling the temperature of the chuck based on the corrected target temperature of the chuck and an actual temperature of the chuck.

2. The control method of claim 1, wherein:
    when the actual temperature of the object to be tested can be fed back, the temperature difference between the temperature of the chuck and the temperature of the object to be tested is calculated based on the actual temperature of the object to be tested and the actual temperature of the chuck;
    the target temperature of the chuck is corrected based on the target temperature of the object to be tested and the temperature difference; and
    the temperature of the chuck is controlled based on the corrected target temperature of the chuck and the actual temperature of the chuck.

3. The control method of claim 2, wherein when the actual temperature of the object to be tested can be fed back, based on a temperature difference between the actual temperature of the chuck and the actual temperature of the object to be tested and the heat amount of the object to be tested, a parameter indicating a correspondence between the heat amount and the temperature difference is updated.

4. The control method of claim 3, wherein the parameter is a gain coefficient between the heat amount and the temperature difference.

5. The control method of claim 3, wherein the parameter is a coefficient of a first order delay function between the heat amount and the temperature difference.

6. The control method of claim 3, wherein the parameter is defined as a function of a distance between a sensor for detecting the temperature of the chuck and a center of the object to be tested.

7. The control method of claim 3, wherein the parameter is defined for each position of the object to be tested.

8. A test device comprising:
    a chuck on which a substrate is mounted, a plurality of objects to be tested being formed on the substrate;
    a tester configured to supply electric power to an object to be tested among the plurality of objects to be tested to test the object to be tested; and
    a controller configured to control a temperature of the chuck,
    wherein the controller is configured to:
    receive a signal indicating whether the controller is capable of obtaining an actual temperature of the object to be tested or not;
    when the actual temperature of the object to be tested cannot be fed back, estimate a heat amount generated by the object to be tested based on information on the electric power supplied to the object to be tested and estimate a temperature difference between the temperature of the chuck and the temperature of the object to be tested based on the estimated heat amount generated by the object to be tested;
    correct a target temperature of the chuck on the basis of a target temperature of the object to be tested and the temperature difference; and
    control the temperature of the chuck on the basis of the corrected target temperature of the chuck and an actual temperature of the chuck.

* * * * *